United States Patent … US 11,682,539 B2
Watakabe et al. … Jun. 20, 2023

(54) CHARGED PARTICLE BEAM APPARATUS AND SETTING ASSISTING METHOD

(71) Applicant: JEOL Ltd., Tokyo (JP)

(72) Inventors: Kazutaka Watakabe, Tokyo (JP); Hirofumi Kuwahara, Tokyo (JP); Takenori Miyahara, Tokyo (JP); Takahide Sakata, Tokyo (JP); Felix Timischl, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 17/380,113

(22) Filed: Jul. 20, 2021

(65) Prior Publication Data

US 2022/0028651 A1 Jan. 27, 2022

(30) Foreign Application Priority Data

Jul. 21, 2020 (JP) ............................. JP2020-124583

(51) Int. Cl.
*H01J 37/244* (2006.01)

(52) U.S. Cl.
CPC ... *H01J 37/244* (2013.01); *H01J 2237/24475* (2013.01); *H01J 2237/24585* (2013.01)

(58) Field of Classification Search
CPC .......... H01J 37/244; H01J 2237/24475; H01J 2237/24585; H01J 37/256; H01J 2237/2485; H01J 37/265; H01J 37/28
See application file for complete search history.

(56) References Cited

U.S. PATENT DOCUMENTS

| 2017/0213695 | A1 | 7/2017 | Bizen et al. |
| 2018/0328864 | A1 | 11/2018 | Harada et al. |
| 2019/0017948 | A1* | 1/2019 | Anan ................. G02B 27/0944 |
| 2020/0126754 | A1 | 4/2020 | Numata et al. |
| 2022/0028649 | A1* | 1/2022 | Watakabe ............. H01J 37/226 |
| 2022/0028653 | A1* | 1/2022 | Watakabe ............. H01J 37/244 |
| 2022/0028654 | A1* | 1/2022 | Watakabe ............. H01J 37/222 |

FOREIGN PATENT DOCUMENTS

| JP | 60207040 A | 10/1985 |
| JP | 2000338088 A | 12/2000 |
| JP | 200239976 A | 2/2002 |
| JP | 2004163135 A | 6/2004 |
| JP | 2006275756 A | 10/2006 |
| JP | 2016016927 A1 | 2/2016 |

(Continued)

OTHER PUBLICATIONS

Extended European Search Report issued in EP21186433.5 dated Jan. 4, 2022.

(Continued)

*Primary Examiner* — David A Vanore
(74) *Attorney, Agent, or Firm* — The Webb Law Firm

(57) ABSTRACT

An average mass, an average density, and an average atomic number for a plurality of elements which form a specimen are calculated. A characteristic X-ray generation depth is calculated based on the average values and a minimum excitation energy of an element of interest. When an illumination condition is set, a reference image including a figure indicating a characteristic X-ray generation range, a numerical value indicating the characteristic X-ray generation depth, or the like, is displayed.

11 Claims, 14 Drawing Sheets

(56) References Cited

FOREIGN PATENT DOCUMENTS

| WO | 2017077627 | A1 | 5/2017 |
| WO | 2018020565 | A1 | 1/2018 |
| WO | 2018193605 | A1 | 10/2018 |

OTHER PUBLICATIONS

Zhao and Darwin, Quantitative Backscattered Electron Analysis Techniques for Cement-Based Materials, A report on research sponsored by The Air Force Office of Scientific Research, The University of Kansas, Jun. 1990, pp. 1-57.
Brooks and McGill, The Application of Scanning Electron Microscopy to Fractography, Materials Characterization, 1995, vol. 33, pp. 195-243.
Lee et al., Studies on Electron Penetration Versus Beam Acceleration Voltage in Energy-Dispersive X-Ray Microanalysis, ICSE, 2006, pp. 610-613.
Frank Krumeich, Properties of Electrons, their Interactions with Matter and Applications in Electron Microscopy, Laboratory of Inorganiz Chemistry, ETH Zurich, 2015, pp. 1-24.
Office Action issued in JP2020124583 dated Jun. 28, 2022.
Wu et al., Bandgap engineering in MBE grown Al1-xGaxN epitaxial columnar nanostructures, Journal of Physics D: Applied Physics, vol. 45, 2012, pp. 1-10.
Pavel Doubrovine, Quantitative X-ray Microanalysis of Fe—Ti Oxides Using Energy-dispersive Spectrometry, Quantitative X-ray Microanalysis of Fe—Ti Oxides, 2004, pp. 1-12.

\* cited by examiner

| ELEMENT | ATOMIC NUMBER (Z) | MASS (A) | DENSITY (ρ) | MINIMUM EXCITATION ENERGY (Ec) | ... |
|---------|-------------------|----------|-------------|-------------------------------|-----|
| **** | **** | **** | **** | **** | ... |
| **** | **** | **** | **** | **** | ... |
| **** | **** | **** | **** | **** | ... |
| ⋮ | ⋮ | ⋮ | ⋮ | ⋮ | ⋮ |

FIG. 3

CHARGED PARTICLE BEAM APPARATUS AND SETTING ASSISTING METHOD

CROSS REFERENCE TO RELATED APPLICATION

This application claims priority to Japanese Patent Application No. 2020-124583 filed Jul. 21, 2020, the disclosure of which is hereby incorporated by reference in its entirety.

BACKGROUND OF THE INVENTION

Field of the Invention

The present disclosure relates to a charged particle beam apparatus and a method of assisting setting, and in particular to a technique to assist setting of an illumination condition.

Description of Related Art

As charged particle beam apparatuses, there are known a scanning electron microscope, an electron beam microanalyzer, an ion beam illumination apparatus, and the like. In the following, a scanning electron microscope will be described as a representative apparatus of these charged particle beam apparatuses.

A scanning electron microscope is an apparatus in which an electron beam which is a charged particle beam is illuminated onto a specimen, and secondary electrons, back-scattered electrons, characteristic X-rays, or the like emitted from the specimen are detected. An image representing a surface or a surface layer of the specimen is formed based on a sequence of detection signals acquired by two-dimensional scanning of the electron beam. With an analysis of the characteristic X-rays emitted from the specimen, a qualitative analysis and a quantitative analysis of the specimen are executed.

In a measurement of the specimen by the scanning electron microscope, an electron penetration depth (an electron beam penetration depth, an electron scattering depth) in the specimen changes depending on an element forming the specimen, and the electron penetration depth in the specimen also changes depending on an accelerating voltage (landing voltage) of the electron beam. Similarly, a depth in the specimen at which the back-scattered electrons are generated (a generation range of back-scattered electrons emitted from the specimen), and a depth in the specimen at which the characteristic X-rays are generated (a generation range of the characteristic X-rays emitted from the specimen) change depending on the element forming the specimen and the accelerating voltage of the electron beam.

In the scanning electron microscope, an illumination condition such as the accelerating voltage is set by designation of a numerical value by a user. In the related art, during setting of the illumination condition, there is no display of a schematic diagram or the like for assisting a setting operation. There is also known a simulation apparatus which estimates an electron scattering range or a signal generation range in the specimen. However, such an apparatus is not a measurement apparatus, and functions as a single entity, and there has been no cooperation between such an apparatus and the charged particle beam apparatus.

JP 2004-163135 A and JP 2006-275756 A disclose X-ray analysis apparatuses. These patent documents disclose calculation of an X-ray generation region in the specimen, and determination of the accelerating voltage based on the X-ray generation region. However, these patent documents do not disclose a technique for assisting the setting of the illumination condition by the user.

JP 2002-39976 A discloses an electron beam microanalyzer in which an X-ray generation range is calculated for each element included in the specimen, for correction of an X-ray intensity. However, J P 2002-39976 A does not describe generation of an image including a figure simulating the signal generation range and a numerical value indicating a size of the signal generation range.

JP 2000-338088 A discloses selection of an element using a periodic table, but does not describe illumination of a charged particle beam onto a specimen. In the present disclosure, the concept of the setting of the illumination condition may include processes to check and change the illumination condition.

An advantage of the present disclosure lies in assisting setting of an illumination condition by a user. Alternatively, an advantage of the present disclosure lies in enabling, in a charged particle beam apparatus, setting of an illumination condition while imagining a range and a size of a physical phenomenon which occurs in a specimen formed from a plurality of elements.

SUMMARY OF THE INVENTION

According to one aspect of the present disclosure, there is provided a charged particle beam apparatus comprising: a receiver that receives a plurality of pieces of element information for a plurality of elements which form a specimen, and a plurality of concentrations of the plurality of elements; a reference image generator that generates a reference image including a figure simulating a range of a physical phenomenon in the specimen and a numerical value indicating a size of the range of the physical phenomenon, based on an illumination condition of a charged particle beam, the plurality of pieces of element information for the plurality of elements, and the plurality of concentrations; and a display that displays the reference image when an actual illumination condition of the charged particle beam is set.

According to another aspect of the present disclosure, there is provided a method of assisting setting, the method comprising: receiving a plurality of pieces of element information for a plurality of elements which form a specimen, and a plurality of concentrations of the plurality of elements; generating a reference image including a figure simulating a range of a physical phenomenon in the specimen and a numerical value indicating a size of the range of the physical phenomenon, based on an illumination condition of a charged particle beam, the plurality of pieces of element information for the plurality of elements, and the plurality of concentrations; and displaying the reference image when an actual illumination condition of the charged particle beam is set.

BRIEF DESCRIPTION OF THE DRAWINGS

Embodiment(s) of the present disclosure will be described based on the following figures, wherein:

FIG. 3 is a diagram showing an example of an element table;

FIG. 5 is a diagram showing a method of calculating an electron penetration depth, a characteristic X-ray generation depth, or the like;

DESCRIPTION OF THE INVENTION

Figure 1:
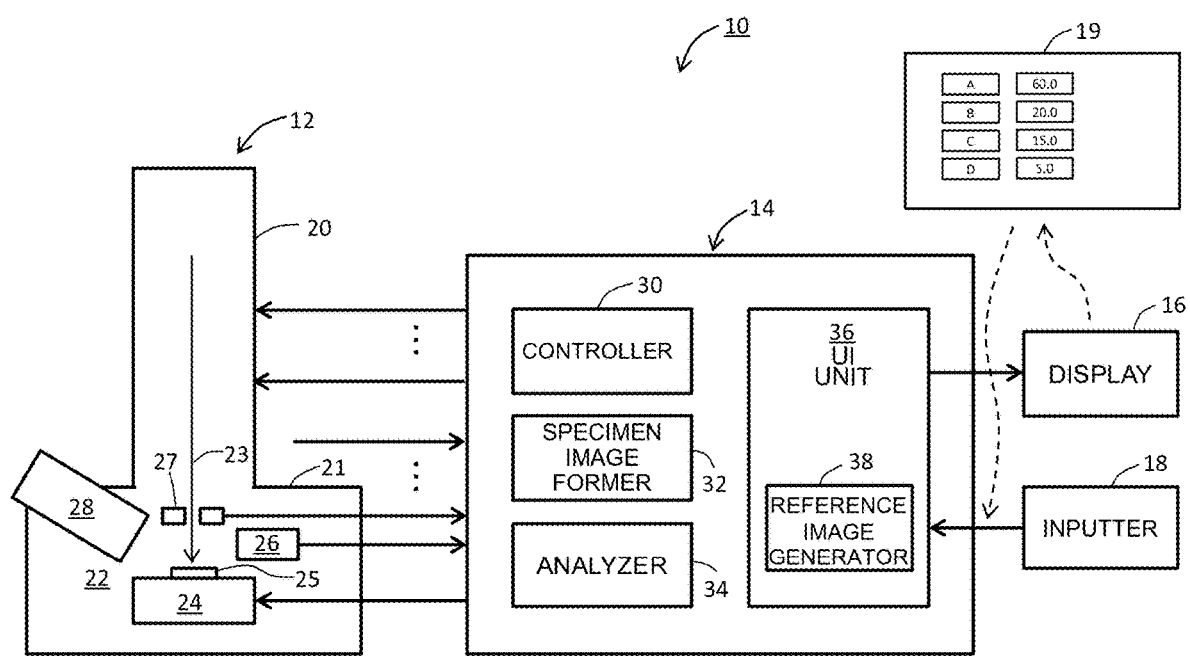
FIG. 1 is a conceptual diagram showing a scanning electron microscope according to an embodiment of the present disclosure.

An embodiment of the present disclosure will now be described with reference to the drawings.

(1) Overview of Embodiment

A charged particle beam apparatus according to an embodiment of the present disclosure comprises a receiver, a reference image generator, and a display. The receiver receives a plurality of pieces of element information for a plurality of elements which form a specimen, and a plurality of concentrations of the plurality of elements. The reference image generator generates a reference image including a figure simulating a range of a physical phenomenon in the specimen and a numerical value indicating a size of the range of the physical phenomenon, based on an illumination condition of a charged particle beam, the plurality of pieces of element information for the plurality of elements, and the plurality of concentrations. When an actual illumination condition of the charged particle beam is set, the reference image is displayed on the display.

According to the structure described above, it becomes possible to set the actual illumination condition while imagining or recognizing an extent of the range of the physical phenomenon in the specimen, through observation of the reference image. In particular, because the plurality of elements which form the specimen and the plurality of concentrations of the plurality of elements are taken into consideration in the generation of the reference image, information which is more accurate than that obtained without considering these pieces of information can be provided to the user. Even for users having poor knowledge of the charged particle beam or the charged particle beam apparatus, appropriate setting of the actual illumination condition can be facilitated through observation of the reference image.

The range of the physical phenomenon may include an electron scattering range (electron penetration range), and a signal generation range. The signal generation range may include a characteristic X-ray generation range and a backscattered electron generation range. Alternatively, there may be generated a reference image which includes a plurality of figures indicating ranges of a plurality of phenomena, and a plurality of numerical values indicating sizes of the ranges of the plurality of physical phenomena. In an embodiment of the present disclosure, when any one of the illumination condition, the plurality of elements, or the plurality of concentrations is changed, the figure indicating the range of the physical phenomenon does not change, and the numerical value indicating the size of the range of the physical phenomenon changes. Through such a change, an optimum illumination condition may be narrowed down.

Based on the displayed figure, a form of the range of the physical phenomenon can be approximately understood, and, based on the displayed numerical value, the size of the range of the physical phenomenon can be approximately understood. The figure and the numerical value are both rough estimates, but the setting of the actual illumination condition by the user can be assisted to a greater extent in comparison to a case in which no information is provided to the user. In an embodiment of the present disclosure, a graphical interface image including the reference image is provided to the user, and a process to check the illumination condition, change the illumination condition, or the like is performed through this image.

In an embodiment of the present disclosure, the charged particle beam is an electron beam. The range of the physical phenomenon includes an electron scattering range, and the numerical value includes an electron penetration depth. In an embodiment of the present disclosure, each of the pieces of element information includes a mass, a density, and an atomic number of each of the elements. The reference image generator calculates an average mass, an average density, and an average atomic number for the specimen based on the plurality of pieces of element information. The reference image generator calculates the electron penetration depth based on the average mass, the average density, and the average atomic number. For calculation of each average value, the plurality of concentrations are taken into consideration.

In an embodiment of the present disclosure, the charged particle beam is an electron beam. The range of the physical phenomenon includes a characteristic X-ray generation range, and the numerical value includes all or a part of a plurality of characteristic X-ray generation depths corresponding to the plurality of elements. The plurality of characteristic X-ray generation depths corresponding to the plurality of elements may be displayed as a numerical value array, or a characteristic X-ray generation depth corresponding to an element of interest among the plurality of elements may be displayed as a numerical value.

In an embodiment of the present disclosure, each of the pieces of element information includes a mass, a density, an atomic number, and a minimum excitation energy of each of the elements. The reference image generator calculates an average mass, an average density, and an average atomic number for the specimen based on the plurality of pieces of element information. The reference image calculator calculates all or a part of the plurality of characteristic X-ray generation depths based on all or a part of the average mass, the average density, the average atomic number, and a plurality of minimum excitation energies corresponding to the plurality of elements.

In an embodiment of the present disclosure, the reference image includes a plurality of element display elements indicating the plurality of elements. In addition, the reference image includes a plurality of concentration display elements which indicate the plurality of concentrations of the elements. The concept of the display element includes a text, a symbol, a figure, a color phase, or the like. Alternatively, the relationship among the plurality of concentrations may be represented by a pie chart, a bar chart, or the like.

In an embodiment of the present disclosure, the illumination condition includes an accelerating voltage of the charged particle beam, and an inclination angle of the specimen. The reference image further includes a numerical value indicating the accelerating voltage, and a numerical value indicating the inclination angle. The reference image changes with a change of any one of the plurality of elements, the plurality of concentrations, the accelerating voltage, or the inclination angle.

A method of assisting setting according to an embodiment of the present disclosure includes a first step, a second step, and a third step. In the first step, a plurality of pieces of element information for a plurality of elements which form a specimen and a plurality of concentrations of the plurality of elements are received. In the second step, a reference image including a figure simulating a range of a physical phenomenon in the specimen and a numerical value indicating a size of the range of the physical phenomenon is generated based on an illumination condition of a charged particle beam, the plurality of element information for the plurality of elements, and the plurality of concentrations. In the third step, the reference image is displayed when a user sets an actual illumination condition of the charged particle beam.

The above-described setting assisting method can be realized by a function of software. In this case, a program for executing the setting assisting method is installed via a network or a transportable recording medium into a charged particle beam apparatus, an information processor, or the like.

(2) Details of Embodiment

FIG. 1 shows a charged particle beam apparatus according to an embodiment of the present disclosure. The charged particle beam apparatus is specifically a scanning electron microscope 10. In the illustrated example configuration, the scanning electron microscope 10 may primarily be separated into a measurement unit 12 and an information processor 14. The information processor 14 is formed from, for example, a personal computer (PC). A display 16 and an inputter 18 are connected to the information processor 14.

As will be described later, specimen information is input through an image 19 displayed on the display 16. More specifically, a plurality of pieces of element information for a plurality of elements which form a specimen 25 and a concentration of each element (a mass ratio of each element in the specimen) are input. The input specimen information is sent to a UI unit 36. Alternatively, the UI unit 36 may acquire the specimen information from an analyzer 34.

The measurement unit 12 comprises a lens barrel 20 and a body 21. An inside of the body 21 is a specimen chamber 22. In the lens barrel 20, an electron beam source, a focusing lens, a deflection scanning lens, an objective lens, or the like is provided. An electron beam 23 is generated by these constituting elements. In the specimen chamber 22, a specimen stage 24 is provided, and the specimen 25 is held by the specimen stage 24. Specifically, a specimen holder holding the specimen 25 is attached to the specimen stage 24. The specimen stage 24 has an XYZ mechanism which moves the specimen 25 in up-and-down and left-and-right directions, a rotational mechanism which rotates the specimen 25, and a tilt mechanism which inclines the specimen 25. A specimen inclination angle is also called a tilt angle. The specimen 25 has a form of, for example, a small piece, a circular disc, or the like. Alternatively, a specimen 25 having a different form may be set as a measurement target.

In the illustrated example structure, a secondary electron detector 26, a back-scattered electron detector 27, and a characteristic X-ray spectrometer 28 are provided at a periphery of the specimen 25. These constituting elements are schematically represented. When the electron beam 23 is illuminated onto the specimen 25, secondary electrons and back-scattered electrons are emitted from the specimen 25, and a characteristic X-ray is emitted from the specimen 25. With the secondary electron detector 26, the secondary electrons emitted from the specimen 25 are detected. With the back-scattered electron detector 27, the back-scattered electrons emitted from the specimen 25 are detected. With the characteristic X-ray spectrometer 28, the characteristic X-ray emitted from the specimen 25 is detected.

The characteristic X-ray spectrometer 28 is, for example, an energy-dispersive characteristic X-ray spectrometer. In place of or in addition to the energy-dispersive characteristic X-ray spectrometer, a wavelength-dispersive characteristic X-ray spectrometer may be provided. Alternatively, a detector other than those described above may be provided. Normally, the electron beam 23 is two-dimensionally scanned with respect to the specimen 25. A plurality of detection signals which are output from the secondary electron detector 26, the back-scattered electron detector 27, and the characteristic X-ray spectrometer 28 are sent to the information processor 14.

The information processor 14 includes a processor which executes an information process, a memory which stores data and a program, or the like. In FIG. 1, a plurality of representative functions realized by the information processor 14 are represented by a plurality of blocks. Specifically, the information processor 14 functions as a controller 30, a specimen image former 32, an analyzer 34, the UI (user interface) unit 36, or the like.

The controller 30 controls operations of various devices in the measurement unit 12. With the controller 30, a plurality of operation parameters for realizing an illumination condition designated by the user are determined. The illumination condition includes an accelerating voltage of the electron beam 23, a tilt angle of the specimen 25, or the like. The accelerating voltage of the electron beam 23 may also be called a landing voltage of the electron beam 23, from the viewpoint of the specimen 25.

The specimen image former 32 forms a two-dimensional image representing a surface or a surface layer of the specimen 25 based on a sequence of detection signals (for example, a sequence of secondary electron detection signals or a sequence of back-scattered electron detection signals) acquired by the two-dimensional scanning of the electron beam 23. The analyzer 34 executes a qualitative analysis and a quantitative analysis of the specimen 25 based on the detection signal which is output from the characteristic X-ray spectrometer 28. Specifically, the analyzer 34 has a function to analyze the plurality of elements which form the specimen and a concentration of each element.

The UI unit 36 generates a graphical user interface (GUI) image provided to the user, and receives information which is input by the user through the GUI image. The UI unit 36 has a reference image generator 38.

The reference image generator 38 is a module which generates a reference image. The reference image is an image including a figure simulating a range of a physical phenomenon in the specimen, and a numerical value indicating a size of the range of the physical phenomenon. The reference image forms an important portion of the GUI image. As the range of the physical phenomenon, there may be exemplified an electron scattering range (electron penetration range) and a signal generation range. As the signal generation range, there may be exemplified a back-scattered electron generation range and a characteristic X-ray generation range. The signal generation range is a generation range of a signal emitted from the specimen. As will be described later, the reference image of the present embodiment includes a plurality of figures indicating ranges of a plurality of physical phenomena, and a plurality of numerical values indicating sizes of the ranges of the plurality of physical phenomena. The reference image corresponds to a vertical cross section of the specimen. Alternatively, a reference image three-dimensionally representing the range of the physical phenomenon may be generated.

The reference image or the GUI image including the reference image is a support image for assisting setting of the illumination condition by the user. The user can input the illumination condition such as the accelerating voltage through the GUI image while imagining or recognizing, through observation of the GUI image, a shape and a size of the range of the physical phenomenon. As described, the UI unit 36 functions as a calculating means, an image generation means, and a reception means.

In the example structure illustrated in FIG. 1, the information processor 14 has the UI unit 36, but alternatively, the UI unit 36 may be included in another information processor. For example, a first information processor including the controller 30, and a second information processor including the UI unit 36 may be provided, and these information processors may cooperate with each other.

The display 16 is formed from a liquid crystal display, an organic EL display device, or the like. The inputter 18 is formed from a keyboard, a pointing device, or the like. Alternatively, a display with a touch panel may be provided as the display 16 and the inputter 18.

Figure 2:
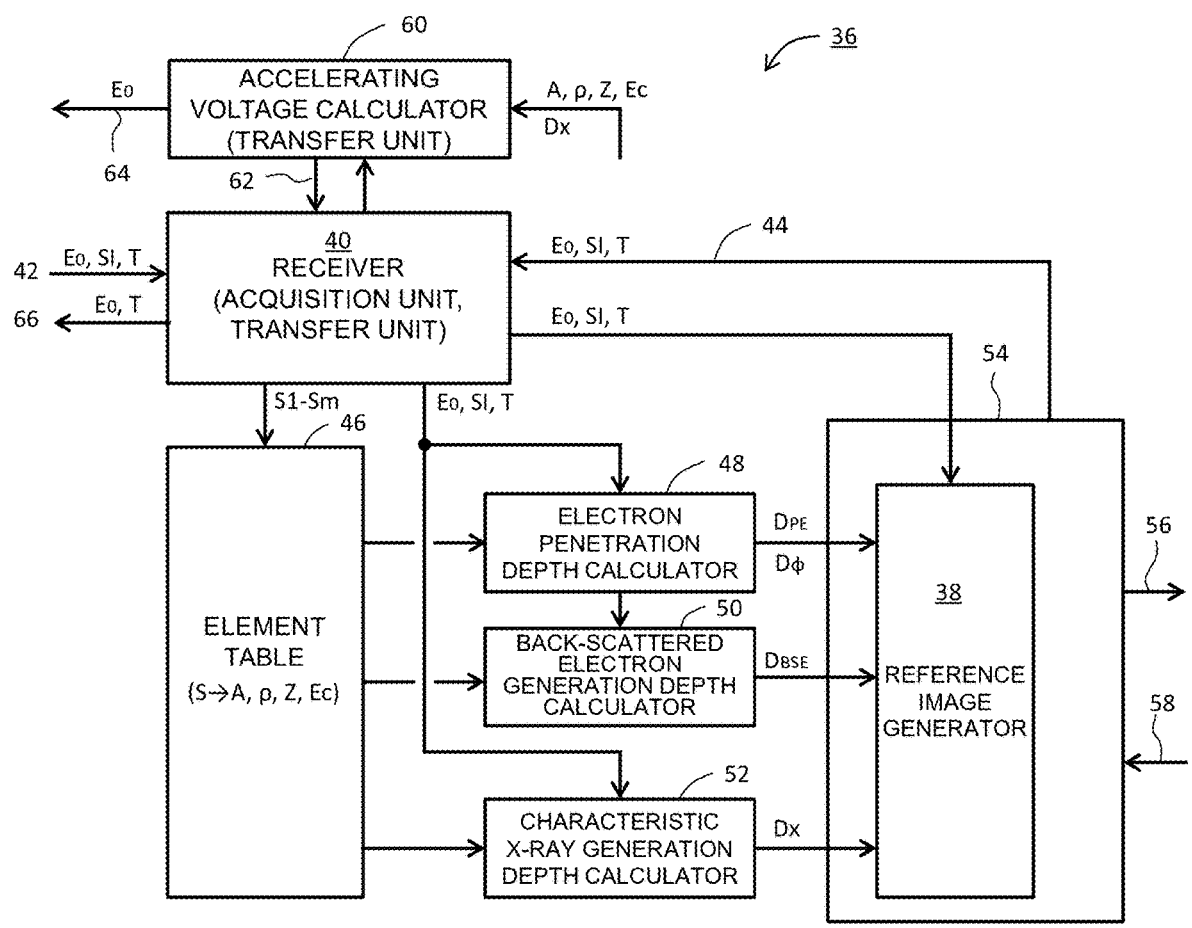
FIG. 2 is a diagram showing an example configuration of an UI (user interface) unit.

FIG. 2 shows an example configuration of the UI unit 36. A plurality of blocks shown in FIG. 2 indicate a plurality of functions realized by software, except for an element table 46. A receiver 40 is a module which receives an accelerating voltage $E_0$, specimen information SI, and a tilt angle T. The receiver 40 has default values for these parameters. A default value of the accelerating voltage $E_0$ is, for example, 5 kV. A default value of the specimen information SI is, for example, aluminum (Al), 100%. A default value of the tilt angle is, for example, 0°. These values are merely exemplary. As will be described later, alternatively, a configuration may be employed in which an accelerating voltage $E_0$ which is set in the controller is acquired, and is set as the default value or an update value.

As shown by reference numeral 42, the receiver 40 functions as an acquisition unit which acquires from the controller the accelerating voltage $E_0$, and the tilt angle T which are set in the controller, in response to an operation of the user. In addition, the receiver 40 functions as an acquisition unit which acquires from the analyzer the specimen information SI. The specimen information SI is information of the plurality of elements S which form the specimen and a plurality of concentrations of the plurality of elements S. Alternatively, the specimen may be formed from a single element. As shown by reference numerals 58 and 44, the receiver 40 has a function to receive the accelerating voltage $E_0$, the specimen information SI, and the tilt angle T which are input by the user through the GUI image.

The receiver 40 also functions as a transfer unit (application unit) which transfers, as an actual illumination condition, the received illumination condition to the controller, to apply the illumination condition; that is, to activate the illumination condition, in response to an operation of the user (refer to reference numeral 66). The illumination condition which is transferred is one or both of the accelerating voltage $E_0$ and the tilt angle T.

According to the specimen information SI which is received by the receiver 40, a plurality of elements S1~Sm are identified. Pieces of information indicating the plurality of elements S1~Sm are supplied from the receiver 40 to the element table 46. Here, m indicates a number of elements, and is an integer of 2 or greater. The element table 46 forms an element database. For each element S which forms the specimen, element information is output from the element table 46. The element information includes a mass A, an atomic number Z, a density ρ, and a minimum excitation energy Ec. The minimum excitation energy Ec corresponds to a minimum energy for generating the characteristic X-ray.

An electron penetration depth calculator 48 calculates an electron penetration depth $D_{PE}$ based on the accelerating voltage $E_0$, the tilt angle T, the plurality of pieces of element information, and the plurality of concentrations. A calculation formula for determining the electron penetration depth $D_{PE}$ will be described later. The electron penetration depth $D_{PE}$ is a maximum value of an electron scattering range in the depth direction. The electron penetration depth calculator 48 also has a function to calculate a lateral width of the electron scattering range; that is, a width $D_\varphi$ in a direction orthogonal to the depth axis. A calculation formula for determining the width $D_\varphi$ of the electron scattering range will be described later.

In the present embodiment, a back-scattered electron generation depth calculator 50 calculates the back-scattered electron generation depth $D_{BSE}$ based on the electron penetration depth $D_{PE}$. If necessary, reference may be made to the plurality of pieces of element information for this calculation. A calculation formula for determining the back-scattered electron generation depth $D_{BSE}$ will be described later.

The characteristic X-ray generation depth calculator 52 calculates one or a plurality of characteristic X-ray generation depths $D_X$ based on the accelerating voltage $E_0$, the tilt angle T, the plurality of pieces of element information, and the plurality of concentrations. For example, the characteristic X-ray generation depth calculator 52 calculates the characteristic X-ray generation depth $D_X$ for a particular element (element of interest) among the plurality of elements which form the specimen, or calculates a plurality of the characteristic X-ray generation depths $D_X$ for the plurality of elements which form the specimen. The element of interest is an element designated by the user. Alternatively, an element having the highest concentration among the plurality of elements which form the specimen may be set as the element of interest. When a plurality of minimum excitation energies Ec exist for one element; that is, when a plurality of characteristic X-rays may be generated from one element, a plurality of the characteristic X-ray generation depths $D_X$ may be calculated, or a characteristic X-ray generation depth $D_X$ may be calculated for a particular characteristic X-ray among the plurality of characteristic X-rays. A calculation formula for the characteristic X-ray generation depth $D_X$ will be described later.

Portions common between the calculation of the electron penetration depth $D_{PE}$ and the calculation of the characteristic X-ray generation depth $D_X$ are calculated, for example, by one of the electron penetration depth calculator 48 or the characteristic X-ray generation depth calculator 52. In the following, there is assumed a configuration in which one characteristic X-ray generation depth $D_X$ is output as a representative of the specimen from the characteristic X-ray generation depth calculator 52.

An image generator 54 is a module which generates the GUI image, and includes the reference image generator 38. To the reference image generator 38, there are supplied the electron penetration depth $D_{PE}$, the width of the electron scattering range $D_\varphi$, the back-scattered electron generation depth $D_{BSE}$, the characteristic X-ray generation depth $D_X$, the accelerating voltage $E_0$, the elements S1~Sm, the concentrations R1~Rm, and the tilt angle T. Reference numeral 56 shows a signal which is output to the display. Reference numeral 58 shows a signal from the inputter.

An accelerating voltage calculator 60 is a module which back-calculates the accelerating voltage $E_0$ from the characteristic X-ray generation depth $D_X$ for the element of interest as necessary. For this back calculation, reference is made to the plurality of pieces of element information, and other information. The back-calculated accelerating voltage $E_0$ is sent to the receiver 40 (refer to reference numeral 62).

In the example configuration of FIG. 2, a configuration may be employed in which, in addition to the input of the illumination condition such as the accelerating voltage on the GUI image, the controller may be asked to again input the illumination condition. This is a safety measure for the user to more cautiously perform the setting of the illumination condition. In this case also, the GUI image is still an image for assisting the setting of the illumination condition. However, as such a re-input is complicated, in the present embodiment, an application button for activating the input illumination condition is prepared. This function will be described later.

Similar to the related art, processes to newly set the illumination condition, to check the illumination condition, and to change the illumination condition can be executed through the setting image (which does not have the reference image) for setting the illumination condition. Such a setting image is generated by the controller shown in FIG. 1. For example, users having abundant knowledge and experience for the electron beam or the scanning electron microscope may set the illumination condition on the setting image, without going through the display of the GUI image.

FIG. 3 shows an example structure of the element table. The element table 46 is constructed on a nonvolatile memory. The element table 46 has a plurality of records 70 corresponding to a plurality of elements. Each record 70 includes element information for an element 72, and the element information is formed from a plurality of pieces of physical information. The plurality of pieces of physical information specifically include an atomic number 74, a mass 76, a density 78, a minimum excitation energy 80, or the like. As described above, a plurality of minimum excitation energies 80 may be registered corresponding to a plurality of characteristic X-rays for each individual element.

Calculation methods will now be described for the electron penetration depth $D_{PE}$, the width of the electron scattering range $D_\varphi$, the back-scattered electron generation depth $D_{BSE}$, and the characteristic X-ray generation depth $D_X$.

First, it is assumed that the specimen is not inclined and that the specimen is formed from a single element. The electron penetration depth $D_{PE}$ is calculated through the following Formula (1) which is known in the art.

[Formula 1]

$$D_{PE} = \frac{2.76 \times 10^{-11} A E_0^{5/3}}{\rho \cdot Z^{8/9}} \frac{(1 + 0.978 \times 10^{-6} E_0)^{5/3}}{(1 + 1.957 \times 10^{-6} E_0)^{4/3}} \quad (1)$$

In Formula (1) described above, A represents a mass of an element (atom), $E_0$ represents the accelerating voltage, ρ represents a density of the element, and Z represents an atomic number. Alternatively, the electron penetration depth $D_{PE}$ may be calculated by the following Formula (2) which is known in the art.

[Formula 2]

$$D_{PE} = 0.033 \frac{A E_0^{1.7}}{\rho \cdot Z} \quad (2)$$

The mass A, the density ρ, and the atomic number Z are specified on the element table. The width of the electron scattering range $D_\varphi$ is generally considered to be approximately equal to the electron penetration depth $D_{PE}$. The following Formula (3) shows this relationship.

[Formula 3]

$$D_\Phi = D_{PE} \quad (3)$$

The back-scattered electron generation depth $D_{BSE}$ is calculated by the following Formula (4). Specifically, the back-scattered electron generation depth $D_{BSE}$ is calculated immediately from the electron penetration depth $D_{PE}$, and as a half of the electron penetration depth $D_{PE}$.

[Formula 4]

$$D_{BSE} = \tfrac{1}{2} D_{PE} \quad (4)$$

The characteristic X-ray generation depth $D_X$ is calculated by the following Formula (5). Ec represents the minimum excitation energy for a particular electron orbital.

[Formula 5]

$$D_X = 0.033 \frac{A(E_0^{1.7} - E_C^{1.7})}{\rho \cdot Z} \quad (5)$$

When the accelerating voltage $E_0$ is to be back-calculated from the characteristic X-ray generation depth $D_X$, the following Formula (6), which is another form of Formula (5), may be utilized.

[Formula 6]

$$E_0 = \left[ \frac{D_X \cdot \frac{\rho Z}{A}}{0.033} + E_C^{1.7} \right]^{\frac{1}{1.7}} \quad (6)$$

On the other hand, when the specimen is inclined by the tilt angle T, a correction coefficient k defined by the following Formula (7) is used.

[Formula 7]

$$K = \tfrac{1}{2}(1 + \cos T) \quad (7)$$

More specifically, the electron penetration depth $D_{PE}$, the back-scattered electron generation depth $D_{BSE}$, and the characteristic X-ray generation depth $D_X$ are respectively multiplied by the correction coefficient k, to derive a corrected electron penetration depth $D_{PE}$, a corrected scattered electron generation depth $D_{BSE}$, and a corrected characteristic X-ray generation depth $D_X$. When the following model is to be employed, the width of the electron scattering range $D_\varphi$ does not depend on the inclination of the specimen. Definition of the depth and the correction coefficient will now be described with reference to FIG. 4.

Figure 4:
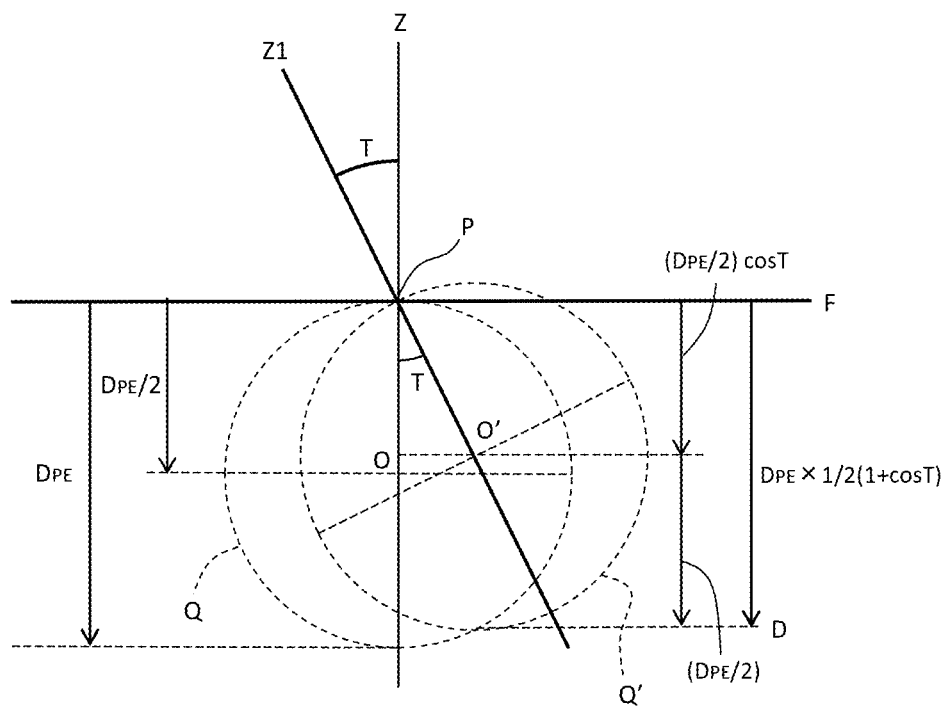
FIG. 4 is a diagram for explaining a definition of a depth.

In FIG. 4, F represents a specimen surface. A Z axis corresponds to an electron beam before inclination. The electron penetration depth is shown by $D_{PE}$. The electron penetration depth $D_{PE}$ is a parameter corresponding to a size of the electron scattering range in the specimen, and, in FIG. 4 the electron scattering range is shown by a circle (in reality, a sphere) Q. An origin of the range is shown by O. A distance from the specimen surface to the origin O (depth on the Z-axis) is $D_{PE}/2$.

The specimen is inclined with the inclination angle T. From another perspective, the electron beam is inclined relative to the specimen. The electron beam after the inclination is shown by Z1. In this manner, in FIG. 4, for the purpose of explanation, a position and an orientation of the specimen are fixed, and the electron beam is inclined. The electron scattering range after the inclination is shown by a circle Q'.

In the present embodiment, a definition is employed defining that a distance from the specimen surface F in a direction orthogonal to the specimen surface F is the depth. When this definition is employed, the depth of an origin O' of the electron scattering range after the inclination of the specimen is $(D_{PE}/2) \times \cos T$. A value obtained by adding a radius of the circle Q', $D_{PE}/2$, to the depth; that is, $D_{PE} \times \frac{1}{2}(1+\cos T)$, is the electron penetration depth after the inclination of the specimen. A value obtained by removing $D_{PE}$ from this calculation formula is the correction coefficient k described above.

Because the definition is employed in which the distance from the specimen surface F in a direction orthogonal to the specimen surface F is the depth, with an increase in the tilt angle T, the electron penetration depth $D_{PE}$, the back-scattered electron generation depth $D_{BSE}$, and the characteristic X-ray generation depth $D_X$ are respectively reduced.

Next, with reference to FIG. 5, calculation of the depths when the specimen is formed from a plurality of elements will be described.

Prior to the calculation of the electron penetration depth $D_{PE}$ or the like, an average mass, an average density, and an average atomic number are calculated (refer to reference numerals 82, 84, and 86). In the following, for convenience of substitution into the calculation formulae which are already described, the average mass will be represented by A, the average density will be represented by p, and the average atomic number will be represented by Z. When masses for m elements (which may also be called m types of elements) which form the specimen are A1~Am, and the concentrations (mass ratios in the specimen) of the m elements are R1~Rm (%), the average mass A can be determined by the following Formula (8), where i is 1, 2, . . . m.

[Formula 8]

$$A=\Sigma(A_i \times R_i) \quad (8)$$

Similarly, the average density p may be determined by the following Formula (9).

[Formula 9]

$$\rho=\Sigma(\rho_i \times R_i) \quad (9)$$

Further, the average atomic number Z may be determined by the following Formula (10).

[Formula 10]

$$Z=\Sigma(Z_i \times R_i) \quad (10)$$

The electron penetration depth $D_{PE}$ is determined by substituting the average mass A, the average density $\rho$, and the average atomic number Z determined in the manner described above, and the accelerating voltage $E_0$ in Formula (1) or Formula (2) described above (refer to reference numeral 88). The width of the electron scattering range $D_\varphi$ is determined from the electron penetration depth $D_{PE}$ (refer to reference numeral 90). Similarly, the back-scattered electron generation depth $D_{BSE}$ is determined from the electron penetration depth $D_{PE}$ (refer to reference numeral 92).

Similarly, the characteristic X-ray generation depth $D_X$ is determined by substituting the average mass A, the average density $\rho$, and the average atomic number Z determined in the manner described above, and the accelerating voltage $E_0$ in Formula (5) described above, and at the same time substituting the minimum excitation energy of the element of interest in Formula (5) (refer to reference numeral 94). Alternatively, for each of the plurality of elements which form the specimen, one or a plurality of the characteristic X-ray generation depths $D_X$ may be calculated.

In a specimen inclined state, a correction coefficient k is determined from Formula (7) described above, based on the tilt angle T (refer to reference numeral 96). The electron penetration depth $D_{PE}$ before correction, the back-scattered electron generation depth $D_{BSE}$ before correction, and the characteristic X-ray generation depth $D_X$ before correction are multiplied by the correction coefficient k, to thereby determine a corrected electron penetration depth $D_{PE}$, a corrected back-scattered electron generation depth $D_{BSE}$, and a corrected characteristic X-ray generation depth $D_X$ (refer to reference numerals 98, 100, and 102).

Figure 5:
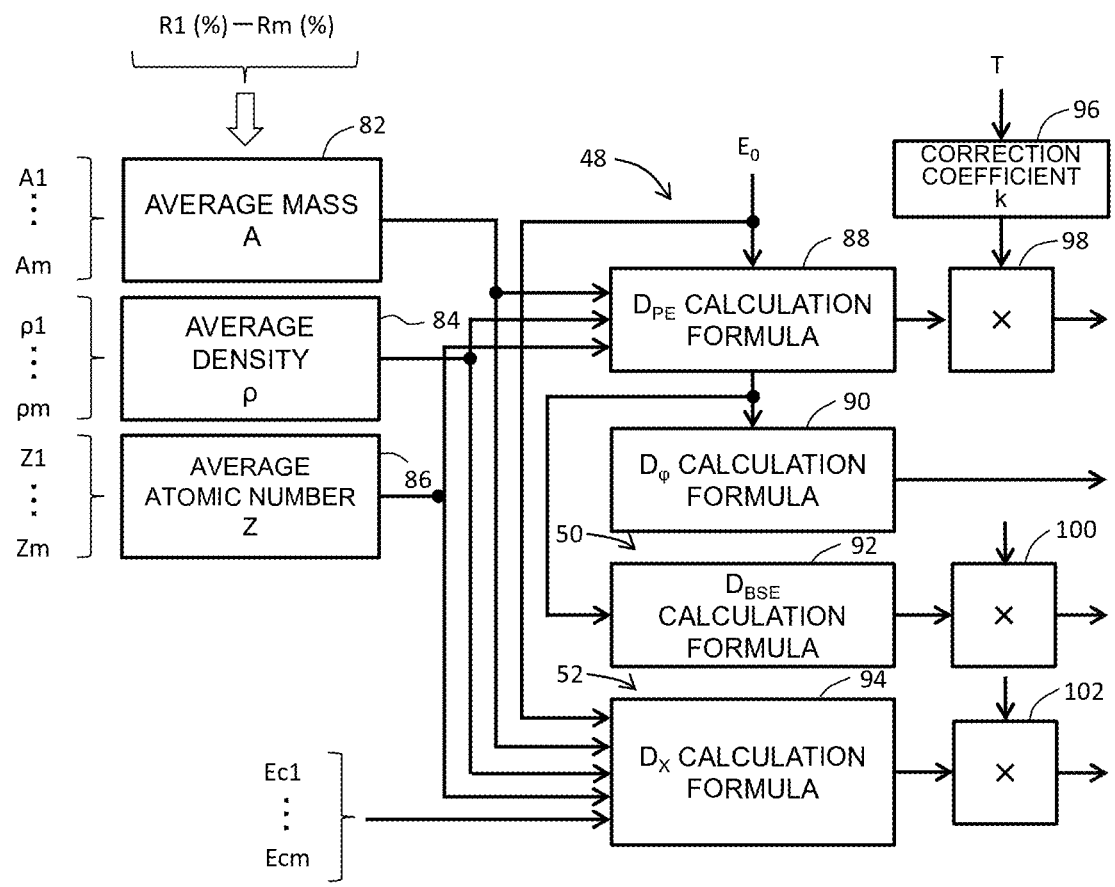

In FIG. 5, the blocks 88, 90, and 98 correspond to the electron penetration depth calculator 48 shown in FIG. 2. The blocks 92 and 100 correspond to the back-scattered electron generation depth calculator 50. The blocks 94 and 102 correspond to the characteristic X-ray generation depth calculator 52 shown in FIG. 2. Calculations corresponding to the blocks 82, 84, 86, and 96 are executed by, for example, the electron penetration depth calculator 48, the characteristic X-ray generation depth calculator 52, or another calculator. FIG. 5 conceptually shows the contents of the calculation, and, in an actual calculation, calculations according to a plurality of calculation formulae may be executed simultaneously or sequentially. Although not shown in FIG. 5, based on a similar idea, the accelerating voltage may be back-calculated from the characteristic X-ray generation depth, based on Formula (8) described above.

The calculation formula and the model described above are merely exemplary, and another calculation formula and another model may be used. In any case, by providing to the user a rough estimate approximately showing the shape and the size of the range of physical phenomena such as the electron scattering range, the back-scattered electron generation range, and the characteristic X-ray generation range, it becomes possible to improve the convenience for the user or to assist the setting of the illumination condition by the user, as compared to the case where none of these pieces of information are provided to the user.

Figure 6:
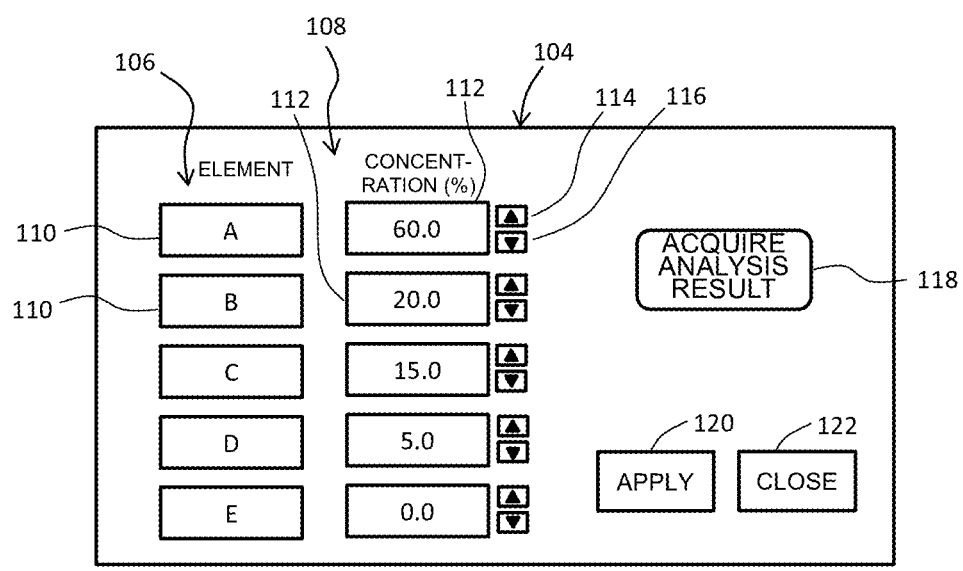
FIG. 6 is a diagram showing an example of an image for inputting specimen information.

FIG. 6 shows an image 104 displayed on a screen of the display when the specimen information is input. The image 104 includes an element input portion 106, and a concentration input portion 108. The element input portion 106 is formed from a plurality of element input fields 110. The concentration input portion 108 is formed from a plurality of concentration input fields 112. FIG. 6 shows five element input fields 110 and five concentration input fields 112, but these numbers are merely exemplary, and may be increased or decreased as necessary.

For the input of the element, an element symbol may be input using a keyboard, or an element may be selected from a periodic table, as will be described later. The selected element is automatically reflected in the element input field 110 in an active state. For the input of the concentration, a numerical value is input using the keyboard. The concentration may be changed or be input by clicking an increase button 114 and a decrease button 116.

An analysis result acquisition button 118 is operated when an analysis result of the analyzer is to be acquired. With this operation, the analysis result is reflected in the element input portion 106 and the concentration input portion 108. That is, one or a plurality of elements are automatically input, and one or a plurality of concentrations are automatically input. After this process, any of the elements or the concentrations may be changed by the user as necessary.

The reference image generator described above has a function to judge that a total of the concentration of the plurality of elements does not equal 100%, and to output an error if such occurs. In this case, the concentration input field 112 or an entirety of the concentration input portion 108 in which the error has occurred may be displayed in a blinking manner. Alternatively, a configuration may be employed in which input of values which cause the error is not received. When there is a dominant element among the plurality of elements, it may be possible to assume that the specimen is formed entirely from this element, and the depths may be calculated accordingly.

When the input for the image 104 is completed, an application button 120 is operated. The depths are calculated based on the plurality of values which are input, and a reference image is generated and displayed, which reflects these calculation results. While in a state in which the reference image is displayed, an arbitrary value may be changed. In this case, the reference image changes with the change of the value. The image 104 is, for example, pop-up displayed on the GUI image including the reference image. A close button 122 is a button which is operated when the image 104 is to be closed. Alternatively, the image 104 may be displayed at all times as an image forming a part of the GUI image.

Figure 7:
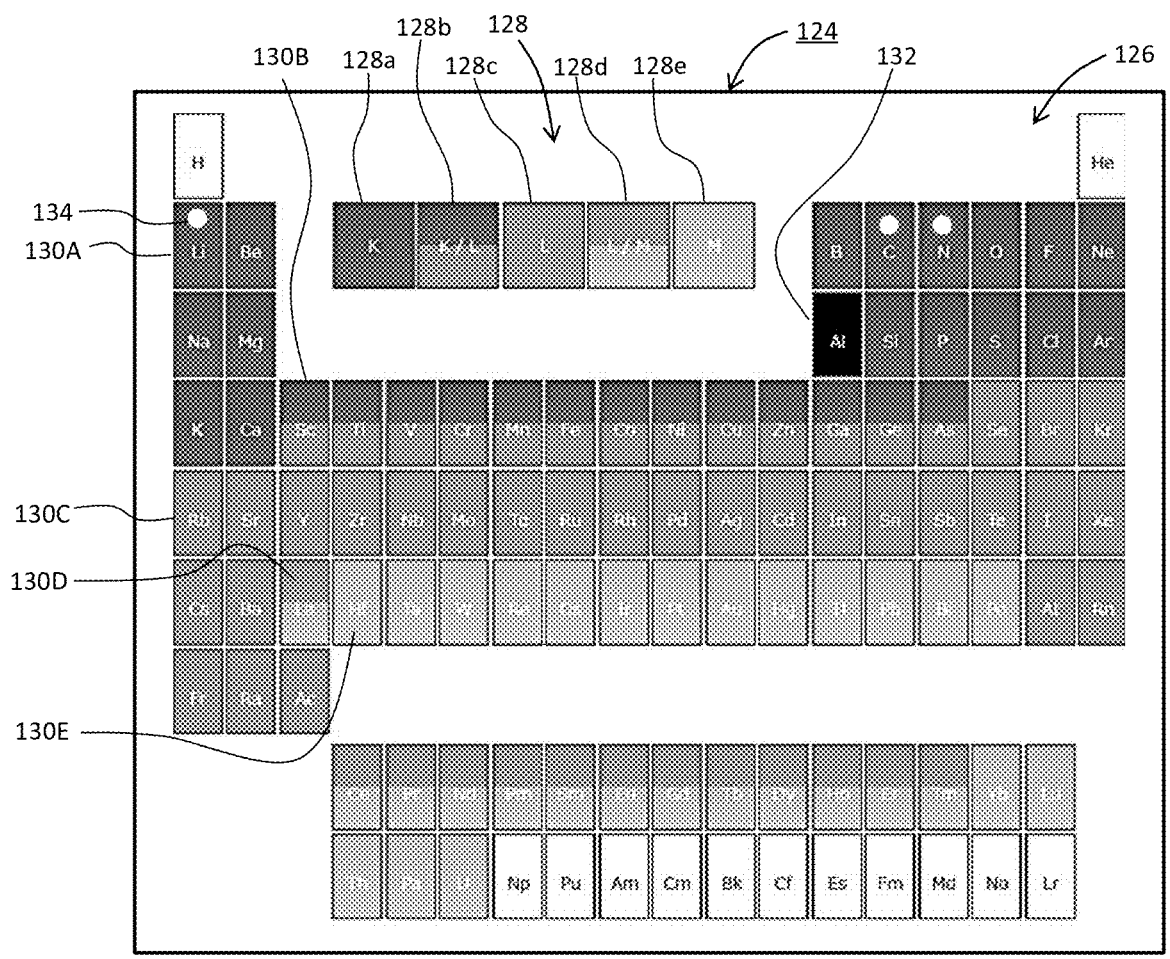
FIG. 7 is a diagram showing an example of an image for selecting an element.

FIG. 7 shows an image 124 for selecting an element. When an element is input, the image 124 may be made to appear as necessary. A substance of the image 124 is a periodic table 126. The image 124 also includes an index 128.

The periodic table 126 is formed from a plurality of element symbols which are two-dimensionally arranged according to a chemical rule. The index 128 is formed from five color patterns 128a-128e in the illustrated configuration. Each of the color patterns 128a-128e shows a type and a number of the characteristic X-ray which may be generated within a variable range of the accelerating voltage. In the illustrated configuration, an element symbol 130A has a first color pattern. An element symbol 130B has a second color pattern. An element symbol 130C has a third color pattern. An element symbol 130D has a fourth color pattern. An element symbol 130E has a fifth color pattern.

Figure 8:
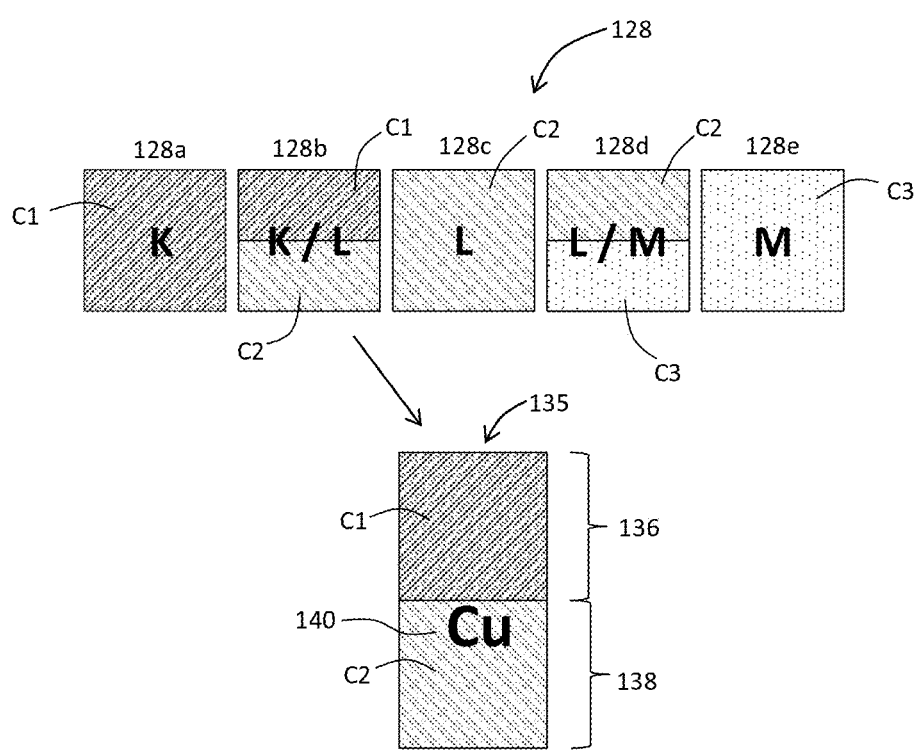
FIG. 8 is a diagram for explaining a plurality of types of color patterns.

With reference to FIG. 8, the color patterns 128a-128e will be described. The first color pattern 128a shows that a K line may be generated, and an entirety of the pattern is colored with a first color C1. The second color pattern 128b shows that the K line and an L line may be generated. An entirety of the color pattern 128b is divided into two in an up-and-down direction, with an upper part colored with the first color C1 and a lower part colored with a second color C2. The third color pattern 128c shows that the L line may be generated, and an entirety of the pattern is colored with the second color C2. The fourth color pattern 128d shows that the L line and an M line may be generated. An entirety of the color pattern 128d is divided into two in the up-and-down direction, with an upper part colored with the second color C2 and a lower part colored with a third color C3. The fifth color pattern 128e shows that the M line may be generated, and an entirety of the pattern is colored with the third color C3. At a center part of each of the color patterns 128a-128e, marks are provided showing the type and number of the characteristic X-rays.

For each element symbol, one of the color patterns is applied according to the element represented by the element symbol; that is, according to the type and the number of the characteristic X-rays that may be generated from the element. To an element symbol 135 exemplified in FIG. 8, the second color pattern is applied. Coloring of the first color C1 is applied to an upper part 136 of this symbol, and coloring of the second color C2 is applied to a lower part 138 of this symbol. At the center part of the element symbol 135, an element symbol 140 is provided.

Referring again to FIG. 7, a mark 134 is displayed for an element symbol corresponding to an already-selected element. Reference numeral 132 shows an element symbol which is a selection target at the current time, and is displayed, for example, with a high brightness. In this case, the display form is desirably changed to maintain visibility of the color pattern. According to such an element selection using the periodic table, the plurality of elements may be selected quickly and without an error, based on the knowledge of chemistry.

Figure 9:
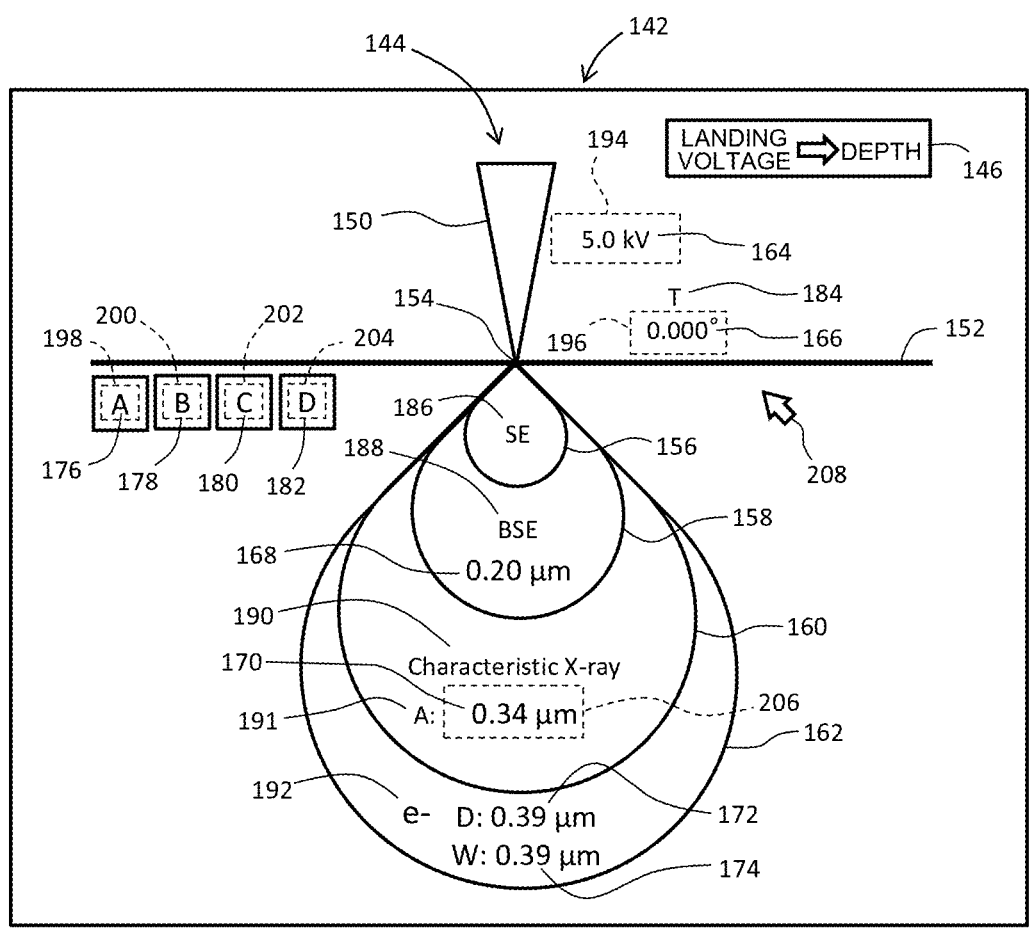
FIG. 9 is a diagram showing a first example of a reference image.

FIG. 9 shows a GUI image 142. The GUI image 142 is an image displayed according to a command by the user when an illumination condition is newly set, an already-set illumination condition is checked, or the already-set illumination condition is changed.

The GUI image 142 includes a reference image 144 of the first configuration, and a guidance display 146. The reference image 144 includes a plurality of FIGS. 150, 152, 156, 158, 160, and 162, a plurality of numerical values 164, 166, 168, 170, 172, and 174, and a plurality of labels (test strings) 176~182, 184, 186, 188, 190, 191, and 192. The reference image 144 corresponds to a vertical cross section of the specimen (cross section including an axis corresponding to the electron beam).

The FIG. 150 is a triangle, and has a downward-oriented pinnacle shape. The FIG. 150 simulates the electron beam. The FIG. 152 is a straight line simulating the specimen surface. An apex 154 of the FIG. 150 comes in contact with the FIG. 152. The apex 154 shows a point of illumination of the electron beam. The numerical value 164 indicates the accelerating voltage (landing voltage). The numerical value 166 indicates the tilt angle. The label 184 is a symbol showing the tilt angle.

Labels 176~182 show a plurality of elements which form the specimen, and each is an element display element. Here, the specimen is a supposed specimen or an actual specimen. The labels 176~182 are specifically element symbols. The labels 176~182 are shown in a number corresponding to a number of elements which form the specimen. For the designation or the selection of the element, the periodic table described above may be used.

The FIG. 156 has a liquid drop shape, and an apex thereof coincides with the apex 154. The FIG. 156 simulates the secondary electron generation range. In the FIG. 156, the label (SE) 186 indicating the secondary electrons is displayed. A size of the FIG. 156 is constant regardless of the accelerating voltage or the like. Alternatively, the size may be changed according to the accelerating voltage or the like.

The FIG. 158 has a liquid drop shape, and an apex thereof coincides with the apex 154. The FIG. 158 simulates the back-scattered electron generation range. In the FIG. 158, the label (BSE) 188 indicating the back-scattered electron is displayed. In addition, the numerical value 168 indicating the back-scattered electron generation depth is displayed in the FIG. 158. A size of the FIG. 158 is constant regardless of the accelerating voltage or the like, but alternatively, similar to the above, the size may be changed according to the accelerating voltage or the like. The numerical value 168 changes with a change of the accelerating voltage, with a change of the specimen information (the plurality of elements and the plurality of concentrations), or with a change of the tilt angle.

The FIG. 160 has a liquid drop shape, and an apex thereof coincides with the apex 154. The FIG. 160 simulates the characteristic X-ray generation range. In the FIG. 160, the label (Characteristic X-ray) 190 indicating the characteristic X-ray is displayed. A size of the FIG. 160 is also constant regardless of the accelerating voltage or the like. Alternatively, the size may be changed according to the accelerating voltage or the like. In the FIG. 160, the numerical value 170 indicating the characteristic X-ray generation depth is displayed. The numerical value indicates a size (a width in the depth direction) of the generation range of the characteristic X-ray (here, a representative characteristic X-ray) emitted from the specimen. The numerical value 170 changes with a change of the accelerating voltage, with a change of the specimen information, or with a change of the tilt angle.

The FIG. 162 has a liquid drop shape, and an apex thereof coincides with the apex 154. The FIG. 162 simulates the electron scattering range, and in the FIG. 162, the label 192 indicating the landing electron is displayed. A size of the FIG. 162 is also constant regardless of the accelerating voltage or the like. Alternatively, the size may be changed according to the accelerating voltage or the like.

In the FIG. 162, the numerical value 172 indicating a size (electron penetration depth) of the electron scattering range is displayed, and the numerical value 174 indicating the width of the electron scattering range is displayed. The numerical value 172 changes with a change of the accelerating voltage, with a change of the element, or with a change of the tilt angle. The numerical value 174 changes with a change of the accelerating voltage or with a change of the element, but does not change with a change of the tilt angle.

The guidance display 146 indicates that the characteristic X-ray generation depth is being calculated from the landing voltage; that is, the accelerating voltage.

A paint process may be applied to the FIGS. 156, 158, 160, and 162. With the paint process, the FIGS. 156, 158, 160, and 162 can be easily distinguished from each other. In overlapping regions of the FIGS. 156, 158, 160, and 162, one of the figures (the figure with a smaller size) is displayed with a priority. As the shapes of the FIGS. 156, 158, 160, and 162, a figure of a shape other than the liquid drop shape such as, for example, a circular shape, an elliptical shape, a vase shape, or the like, may alternatively be employed. When the size relationship is reversed between a plurality of ranges, such may be displayed or one or a plurality of figures may be deleted.

Blocks 194, 196, 198~204, and 206 shown with broken lines indicate that values included therein (numerical values or symbols) may be changed. More specifically, these blocks show regions in which a pointer 208 is recognized.

Figure 10:
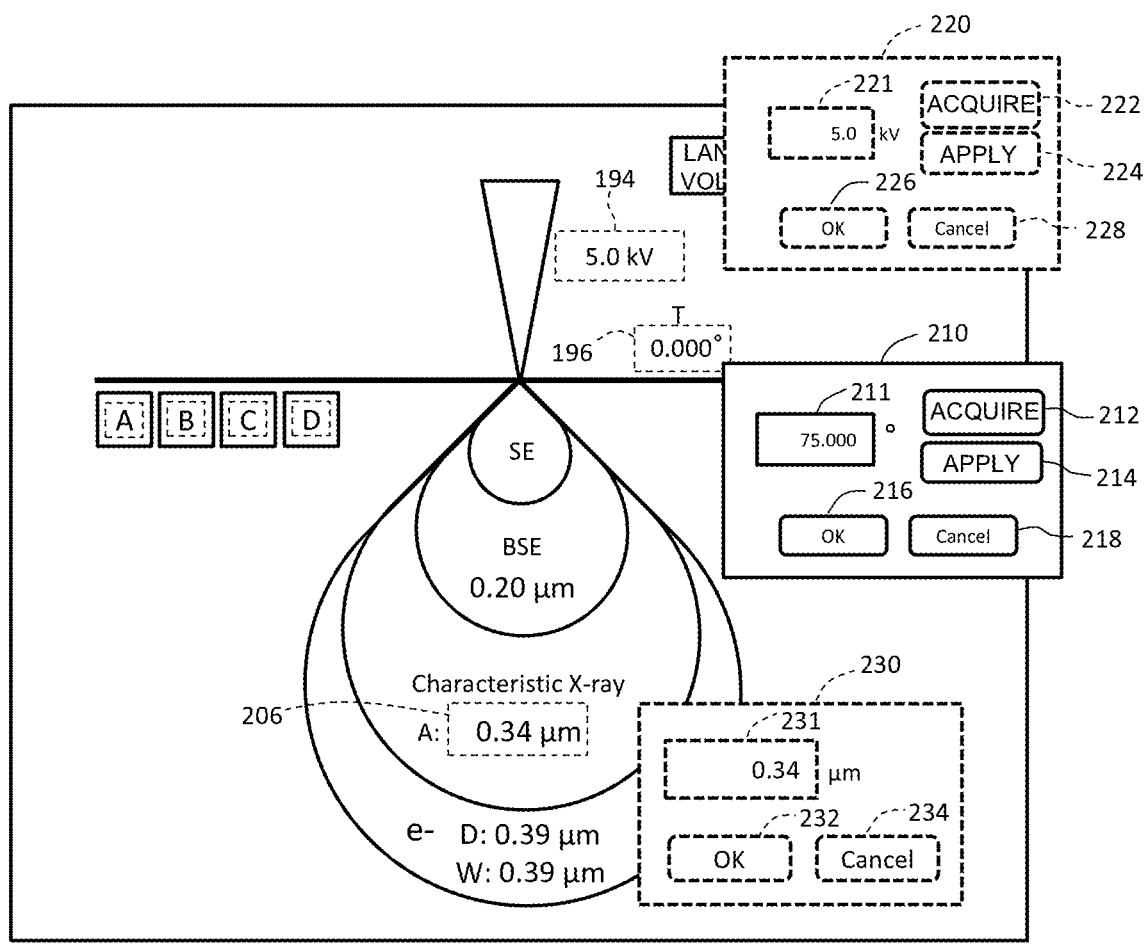
FIG. 10 is a diagram showing a plurality of windows which are selectively pop-up displayed.

As shown in FIG. 10, when the pointer is moved to a position inside the block 196 and a click operation is performed, a window 210 is pop-up displayed. The window 210 includes an input field 211 for the tilt angle, an acquisition button 212, an application button 214, an OK button 216, and a cancel button 218. The tilt angle may be input using the input field 211. When the acquisition button 212 is operated, the tilt angle which is set in the controller is reflected in the input field 211. When the application button 214 is operated, the tilt angle which is input in the input field 211 is sent to the controller, and is set in the controller.

As shown in FIG. 10, when the pointer is moved to a position inside the block 194 and a click operation is performed, a window 220 is pop-up displayed. The window 220 includes an input field 221 for the accelerating voltage, an acquisition button 222, an application button 224, an OK button 226, and a cancel button 228. The accelerating voltage may be input using the input field 221. When the acquisition button 222 is operated, the accelerating voltage which is set in the controller is reflected in the input field 221. When the application button 224 is operated, the accelerating voltage which is input in the input field 221 is sent to the controller, and is set in the controller.

As shown in FIG. 10, when the pointer is moved to a position inside the block 206 and a click operation is performed, a window 230 is pop-up displayed. The window 230 includes an input field 231 for the characteristic X-ray generation depth, an OK button 232, and a cancel button 234. The characteristic X-ray generation depth may be input using the input field 231. When the OK button 232 is operated after the characteristic X-ray generation depth is input, an accelerating voltage corresponding to the input characteristic X-ray generation depth is back-calculated, and is displayed. With a change of the accelerating voltage, the electron penetration depth or the like related to the accelerating voltage is changed. In this case, a guidance indicating the back-calculation state is displayed.

The change of the specimen information has already been described. When the specimen information is changed, a reference image is generated based on the new specimen information. That is, the reference image is updated. Alternatively, at the time when the pointer is moved to a position inside the block 206, a plurality of characteristic X-ray generation depths for the plurality of characteristic X-rays which may be generated from the specimen may be displayed as a numerical value array. Alternatively, at the time when the pointer is moved to a position inside the block 194, a plurality of accelerating voltages corresponding to the plurality of characteristic X-rays which may be generated from the specimen may be displayed as a numerical value array.

Figure 11:
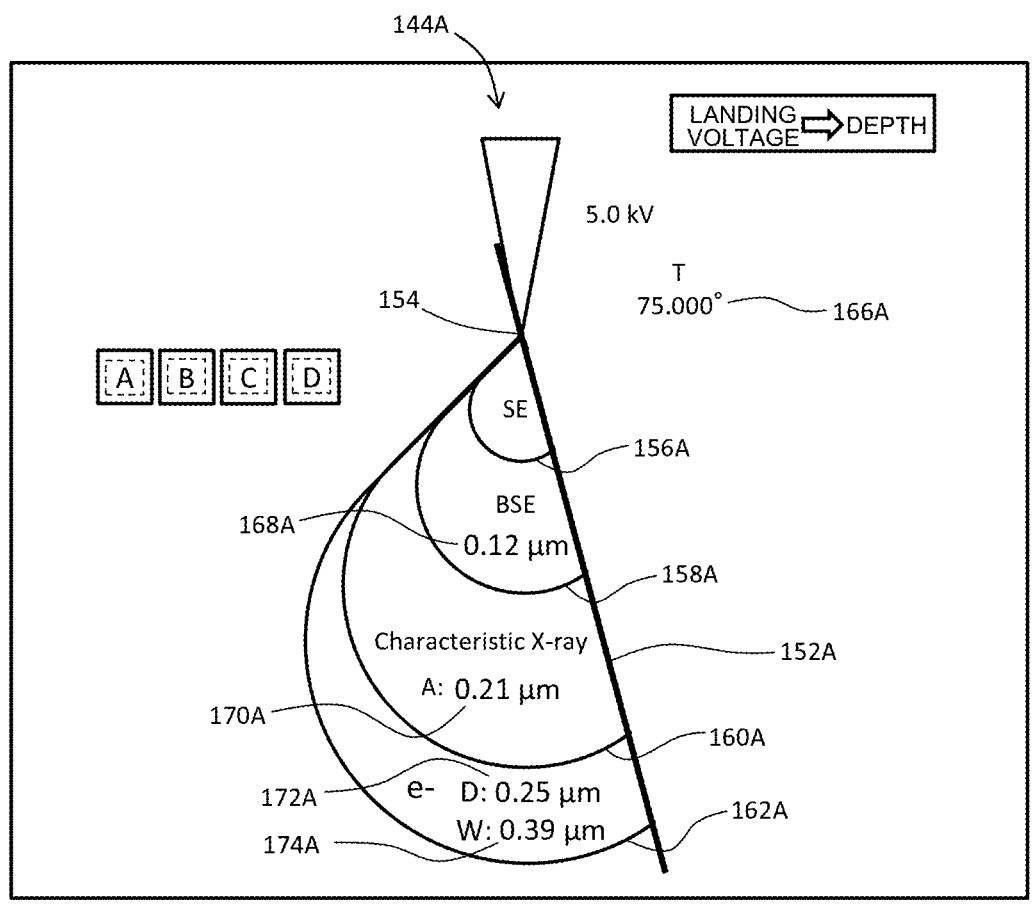
FIG. 11 is a diagram showing a reference image representing an inclined state.

FIG. 11 shows a reference image 144A when the specimen is inclined. A numerical value 166A indicates the tilt angle. A FIG. 152A (straight line) representing the specimen surface is in an inclined state. Of the plurality of the original figures, portions protruding on an upper side of the straight line is mask processed, and FIGS. 156A, 158A, 160A, and 162A after the mask process are shown. As described above, a plurality of depths 168A, 170A, and 172A displayed as a plurality of numerical values are respectively depths in a direction orthogonal to the specimen surface.

As described, according to the present embodiment, when the specimen is formed from a plurality of elements, a reference image taking into consideration the plurality of elements and their concentrations can be provided to the user. Through observation of the reference image, the setting of the illumination condition may be facilitated.

Figure 12:
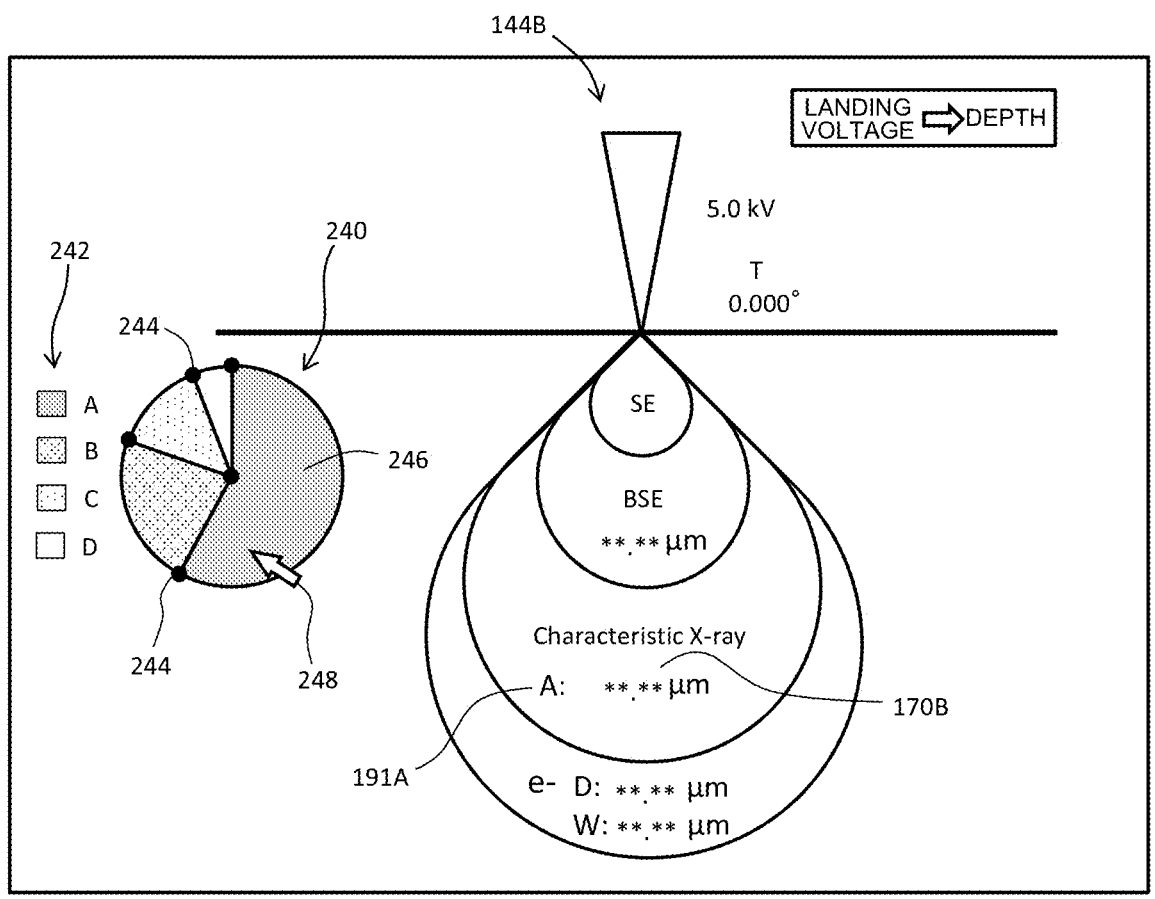
FIG. 12 is a diagram showing a second example of the reference image.

FIG. 12 shows a reference image 144B according to a second configuration. In the reference image 144B, a pie chart 240 is displayed alongside the plurality of figures displaying a plurality of ranges. The pie chart 240 shows a plurality of elements which form the specimen, and concentrations of the elements. That is, the pie chart 240 functions as a plurality of element display elements and a plurality of concentration display elements along with a color map 242 to be described below. For example, when the specimen is formed from four elements including elements A, B, C, and D, four regions corresponding to the four elements are provided in the pie chart 240. The regions are represented with colors different from each other. Through the color map 242, a mutual relationship among the element, the region, and the color can be checked.

In the pie chart 240, an area of each region (more specifically, a length of an arc) corresponds to each concentration. For example, each concentration may be changed by moving, using a pointer 248, a particular node 244 provided between two adjacent regions, along a circumference.

When the reference image 144B of the second configuration is employed, a characteristic X-ray depth for an element corresponding to a region designated by the pointer 248 may be displayed as a numerical value. For example, in FIG. 12, a label 191A indicates the element A, and a characteristic X-ray generation depth 170B is a depth for the element A. According to this configuration, the element of interest can be easily switched.

Figure 13:
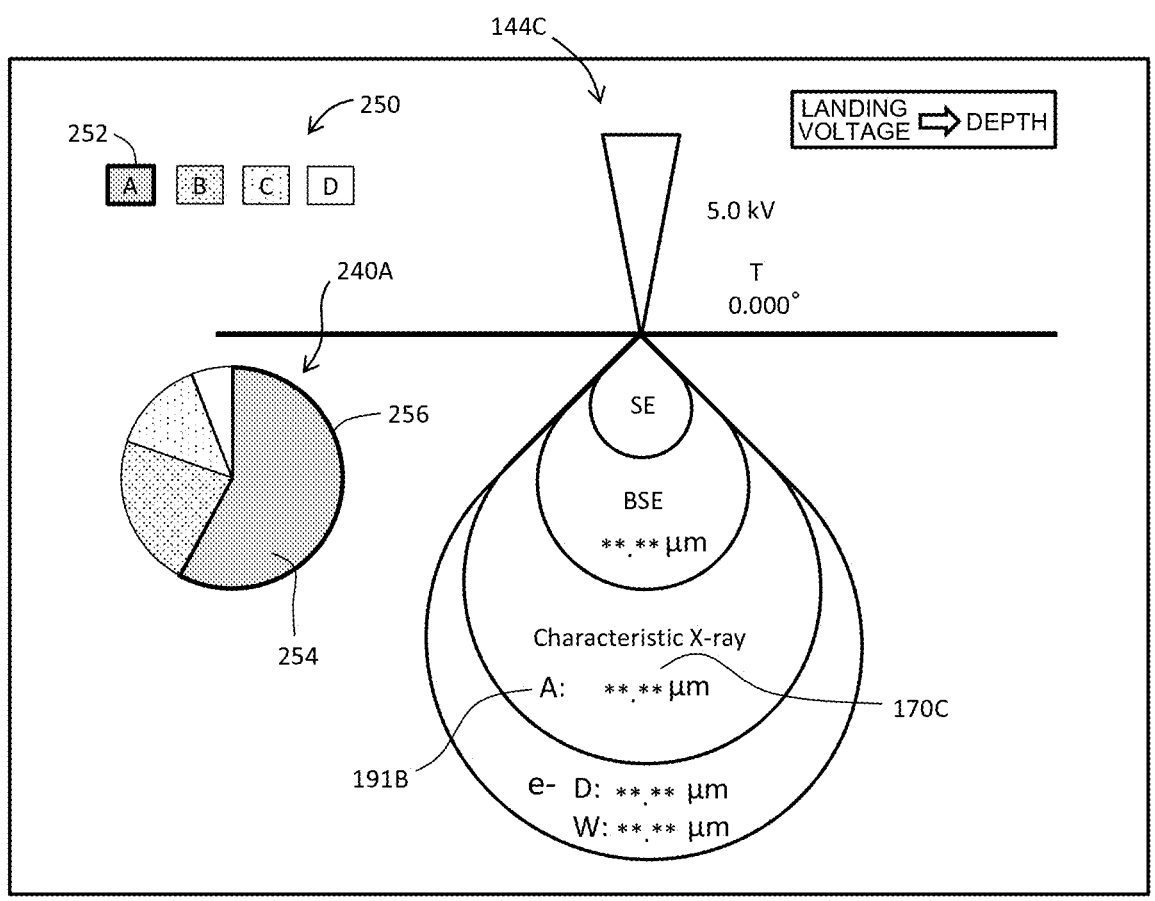
FIG. 13 is a diagram showing a third example of the reference image.

FIG. 13 shows a reference image 144C according to a third configuration. The reference image 144C includes a button array 250 formed from a plurality of buttons corresponding to a plurality of elements. At the time when a particular button 252 in the button array 250 is selected, a label 191B indicating an element corresponding to the button may be displayed, and a numerical value 170C indicating the characteristic X-ray generation depth for the element may be displayed.

Figure 14:
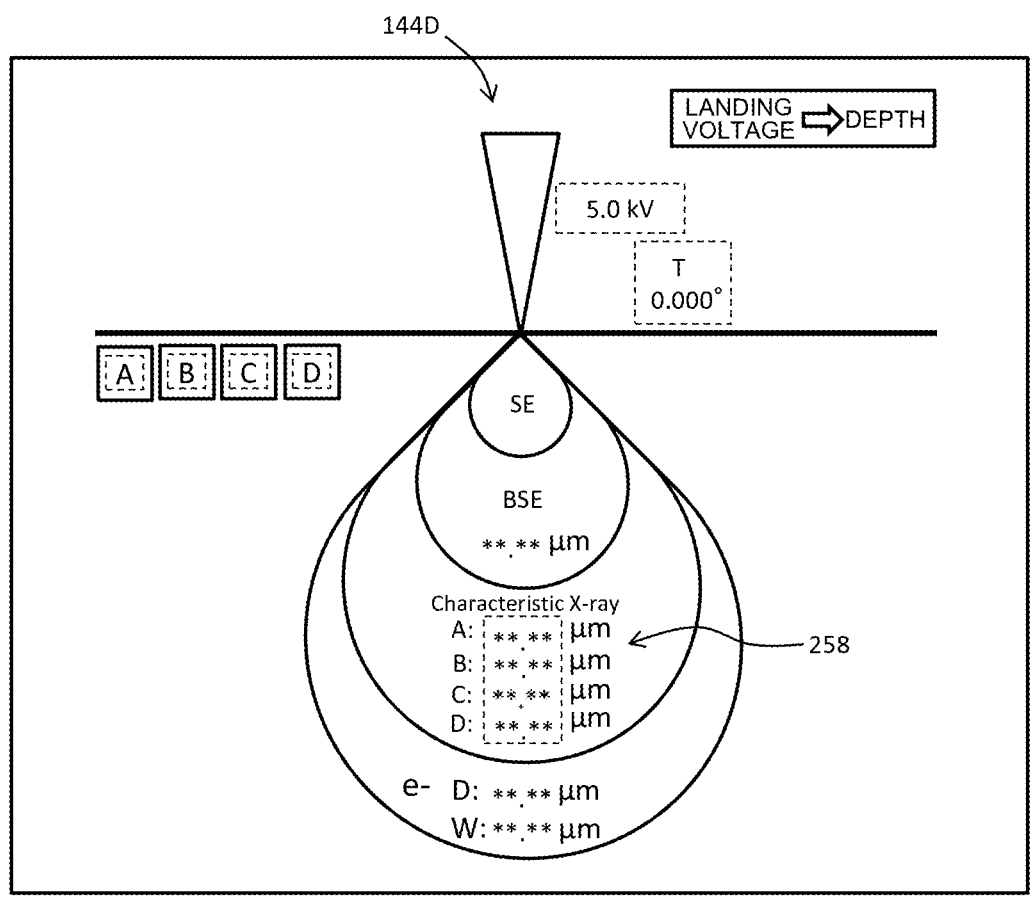
FIG. 14 is a diagram showing a fourth example of the reference image.

FIG. 14 shows a reference image 144D according to a fourth configuration. In the reference image 144D, a numerical value array 258 showing a plurality of characteristic X-ray generation depths corresponding to a plurality of elements A~D is displayed. In this manner, a plurality of characteristic X-ray generation depths may be simultaneously displayed, corresponding to the plurality of characteristic X-rays which may be generated.

In the embodiment described above, a scanning electron microscope is described. Alternatively, the above-described structures may be applied to other charged particle beam apparatuses.

The invention claimed is:

1. A charged particle beam apparatus comprising:
    a measurement unit comprising a charged particle beam source for a charged particle beam, and a specimen chamber for a specimen, the charged particle beam being illuminated onto the specimen in the specimen chamber;
    an element table database having a plurality of pieces of element information, each of which element information comprises a mass, a density, an atomic number, and a minimum excitation energy;
    a processor configured to:
        receive, from the element table database, a plurality of pieces of element information for a plurality of specimen elements which form the specimen, receive a plurality of concentrations of the plurality of specimen elements, and receive an illumination condition comprising an accelerating voltage of the charged particle beam and an inclination angle of the specimen;
        calculate an average mass, an average density, and an average atomic number for the plurality of specimen elements, based on the plurality of pieces of element information for the plurality of specimen elements and the plurality of concentrations;
        calculate a characteristic X-ray generation depth corresponding to a specimen element of interest selected from the plurality of specimen elements, based on the illumination condition of the charged particle beam, the average mass, the average density, the average atomic number, and a minimum excitation energy of the specimen element of interest;
        generate a reference image including a figure simulating a range of a physical phenomenon in the specimen and a numerical value indicating a size of the range of the physical phenomenon, based on the illumination condition of the charged particle beam, the plurality of pieces of element information for the plurality of specimen elements, and the plurality of concentrations, wherein the range of physical phenomenon comprises a characteristic X-ray generation range, wherein the characteristic X-ray generation range is a range of a characteristic X-ray signal emitted from the specimen, wherein the figure includes a figure simulating the characteristic X-ray generation range corresponding to the specimen element of interest, and wherein the numerical value includes the characteristic X-ray generation depth corresponding to the specimen element of interest; and
    a display configured to display the reference image when an actual illumination condition of the charged particle beam is set;
    wherein the processor is further configured to:
        control the measurement unit according to the actual illumination condition.

2. The charged particle beam apparatus according to claim 1, wherein the charged particle beam is an electron beam, the range of the physical phenomenon comprises an electron scattering range, and the numerical value includes an electron penetration depth.

3. The charged particle beam apparatus according to claim 2,
    wherein the processor is further configured to:
        calculate the electron penetration depth based on the average mass, the average density, and the average atomic number.

4. The charged particle beam apparatus according to claim 1, wherein the charged particle beam is an electron beam, and the numerical value includes all or a part of a plurality of characteristic X-ray generation depths corresponding to the plurality of specimen elements.

5. The charged particle beam apparatus according to claim 1, wherein the reference image comprises a plurality of element display elements indicating the plurality of specimen elements.

6. The charged particle beam apparatus according to claim 1, wherein the reference image comprises a plurality of concentration display elements indicating the plurality of concentrations of the plurality of specimen elements.

7. The charged particle beam apparatus according to claim 1, wherein the illumination condition comprises an accelerating voltage of the charged particle beam, and an inclination angle of the specimen, the reference image further comprises a numerical value indicating the accelerating voltage, and a numerical value indicating the inclination angle, and the reference image changes with a change of any one of the plurality of specimen elements, the plurality of concentrations, the accelerating voltage, or the inclination angle.

8. The charged particle beam apparatus according to claim 1, wherein the measurement unit comprises:
a characteristic X-ray spectrometer; and
wherein the measurement unit is configured to:
provide a detection signal to the processor, wherein the detection signal comprises a signal that is output from the characteristic X-ray spectrometer.

9. The charged particle beam apparatus according to claim 8, wherein the processor is further configured to:
perform a qualitative analysis and a quantitative analysis of the specimen based on the signal which is output from the characteristic X-ray spectrometer, wherein the signal comprises characteristic X-rays emitted by the specimen;
wherein the qualitative analysis and the quantitative analysis of the specimen comprise an analysis of a plurality of elements that form the specimen and an analysis of a concentration of each element of the plurality of elements that form the specimen based on the characteristic X-rays emitted by the specimen.

10. A charged particle beam apparatus comprising:
a charged particle beam source for a charged particle beam,
a specimen chamber for a specimen, the charged particle beam being illuminated onto the specimen in the specimen chamber;
a characteristic X-ray spectrometer;
an element table database having a plurality of pieces of element information, wherein the plurality of pieces of element information comprises a mass, a density, an atomic number, and a minimum excitation energy of each element of a plurality of elements;
a display; and
a processor configured to:
receive, from the element table database, the plurality of pieces of element information for a plurality of specimen elements which form the specimen and a plurality of concentrations of the plurality of specimen elements;
receive an illumination condition comprising an accelerating voltage of the charged particle beam and an inclination angle of the specimen;
calculate an average mass, an average density, and an average atomic number for the plurality of specimen elements based on the plurality of pieces of element information for the plurality of specimen elements and the plurality of concentrations;
calculate a characteristic X-ray generation depth corresponding to a specimen element of interest of the plurality of specimen elements, based on the illumination condition of the charged particle beam, the average mass, the average density, the average atomic number, and a minimum excitation energy of the specimen element of interest;
generate a reference image comprising a figure simulating a range of a characteristic X-ray generation range in the specimen and a numerical value indicating a size of the range of the characteristic X-ray generation range based on the illumination condition of the charged particle beam, the plurality of pieces of element information for the plurality of specimen elements, and the plurality of concentrations, wherein the characteristic X-ray generation range is a range of a characteristic X-ray signal emitted from the specimen, and wherein the figure comprises a figure simulating the characteristic X-ray generation range corresponding to the specimen element of interest, and wherein the numerical value includes the characteristic X-ray generation depth corresponding to the specimen element of interest;
cause a graphical interface image comprising the reference image to be displayed on the display based on the illumination condition of the charged particle beam;
control the charged particle beam source according to the illumination condition;
receive, from the characteristic X-ray spectrometer, a detection signal that comprises characteristic X-rays emitted by the specimen; and
perform an analysis of the specimen based on the detection signal from the characteristic X-ray spectrometer, wherein the analysis comprises a qualitative analysis of the plurality of elements which form the specimen and a quantitative analysis of a concentration of each element of the plurality of elements which form the specimen based on the characteristic X-rays emitted by the specimen.

11. The charged particle beam apparatus according to claim 10, wherein the processor is further configured to:
calculate a corrected characteristic X-ray generation depth corresponding to the specimen element of interest based on a title angle at which the specimen is inclined in the specimen chamber; and
wherein, when generating the reference image, the processor is configured to:
generate the reference image based on the corrected characteristic X-ray generation depth.

* * * * *